(12) United States Patent
Sakakida

(10) Patent No.: US 12,401,334 B2
(45) Date of Patent: Aug. 26, 2025

(54) SEMICONDUCTOR INTEGRATED CIRCUIT

(71) Applicants: DENSO CORPORATION, Kariya (JP); MIRISE Technologies Corporation, Nisshin (JP)

(72) Inventor: Isao Sakakida, Nisshin (JP)

(73) Assignees: DENSO CORPORATION, Kariya (JP); MIRISE Technologies Corporation, Nisshin (JP)

(*) Notice: Subject to any disclaimer, the term of this patent is extended or adjusted under 35 U.S.C. 154(b) by 739 days.

(21) Appl. No.: 17/551,369

(22) Filed: Dec. 15, 2021

(65) Prior Publication Data

US 2022/0200553 A1    Jun. 23, 2022

(30) Foreign Application Priority Data

Dec. 23, 2020 (JP) ................ 2020-213996

(51) Int. Cl.
  *H03F 1/22* (2006.01)
  *H01L 23/66* (2006.01)
  *H03F 3/195* (2006.01)
  *H03F 3/45* (2006.01)

(52) U.S. Cl.
  CPC ......... *H03F 3/45188* (2013.01); *H01L 23/66* (2013.01); *H03F 1/223* (2013.01); *H03F 3/195* (2013.01); *H01L 2223/6655* (2013.01)

(58) Field of Classification Search
  CPC ..................................... H03F 1/22
  USPC ................................ 330/311, 310
  See application file for complete search history.

(56) References Cited

U.S. PATENT DOCUMENTS

| | | | |
|---|---|---|---|
| 11,152,907 B2* | 10/2021 | Ayranci | H03F 1/3205 |
| 11,588,447 B2* | 2/2023 | Golat | H03F 1/223 |
| 2006/0232307 A1 | 10/2006 | Kanno et al. | |
| 2018/0062581 A1 | 3/2018 | Seshita et al. | |
| 2019/0334560 A1 | 10/2019 | Chi et al. | |
| 2019/0372534 A1 | 12/2019 | Seshita et al. | |
| 2020/0328724 A1* | 10/2020 | Ayranci | H03G 1/0029 |

(Continued)

FOREIGN PATENT DOCUMENTS

| | | |
|---|---|---|
| JP | 2005-027181 A | 1/2005 |
| JP | 2005-311689 A | 11/2005 |
| JP | 2007-135097 A | 5/2007 |

(Continued)

OTHER PUBLICATIONS

Kuo et al., "A 1.5W Class-F RF Power Amplifier in 0.2μm CMOS Technology", IEEE ISSCC Dig., pp. 154-155, Feb. 2001.

(Continued)

*Primary Examiner* — Henry Choe
(74) *Attorney, Agent, or Firm* — Posz Law Group, PLC

(57) ABSTRACT

A semiconductor integrated circuit includes an input terminal, an output terminal, and a multi-stage connection unit including multiple MOS transistors connected in multiple stages between the input terminal and the output terminal. The MOS transistors include an input stage transistor connected to the input terminal and an output stage transistor connected to the output terminal. A thickness of a gate dielectric of the output stage transistor is equal to a thickness of a gate dielectric of the input stage transistor, and a gate length of the output stage transistor is longer than a gate length of the input stage transistor.

8 Claims, 11 Drawing Sheets

(56) References Cited

U.S. PATENT DOCUMENTS

2022/0278653 A1\* 9/2022 Sanner ..................... H03F 3/21

FOREIGN PATENT DOCUMENTS

| JP | 2011-004313 A | 1/2011 |
| JP | 2017228807 A | 12/2017 |
| JP | 2018-067878 A | 4/2018 |

OTHER PUBLICATIONS

Son et al., "A CMOS Power Amplifier Using a Balun Embedded Driver Stage for IEEE 802.11N WLAN Applications", Progress In Electromagnetics Research C 2019, 90: pp. 169-181.

\* cited by examiner

FREQ (40.00GHz to 40.00GHz)

N1

N4-N3

N3

N4-N6

N2

N5

SEMICONDUCTOR INTEGRATED CIRCUIT

CROSS REFERENCE TO RELATED APPLICATION

The present application claims the benefit of priority from Japanese Patent Application No. 2020-213996 filed on Dec. 23, 2020. The entire disclosure of the above application is incorporated herein by reference.

TECHNICAL FIELD

The present disclosure relates to a semiconductor integrated circuit.

BACKGROUND

JP 2007-135097 A discloses a semiconductor integrated circuit including a multi-stage connection unit in which multiple transistors are connected in multiple stages. The disclosure of JP 2007-135097 A is incorporated herein by reference as an explanation of technical elements in the present disclosure.

SUMMARY

The present disclosure provides a semiconductor integrated circuit including an input terminal, an output terminal, and a multi-stage connection unit. The multi-stage connection unit includes multiple MOS transistors connected in multiple stages between the input terminal and the output terminal. The MOS transistors include an input stage transistor connected to the input terminal and an output stage transistor connected to the output terminal. A thickness of a gate dielectric of the output stage transistor is equal to a thickness of a gate dielectric of the input stage transistor, and a gate length of the output stage transistor is longer than a gate length of the input stage transistor.

BRIEF DESCRIPTION OF DRAWINGS

Objects, features and advantages of the present disclosure will become apparent from the following detailed description made with reference to the accompanying drawings. In the drawings.

DETAILED DESCRIPTION

In recent years, applications for high frequency circuits using an advanced complementary metal oxide semiconductor (CMOS) process with a gate length of 100 nm or less have been proposed. Specific examples thereof include millimeter-wave radars using 24 GHz band or 79 GHz band, and fifth-generation mobile communication systems using 28 GHz band or 39 GHz band. In a power amplifier used in such a millimeter wave band, the maximum available power gain (MAG) and the maximum stable power gain (MSG), which indicate the performance of high frequency gain of a transistor, are low. Therefore, in millimeter-wave band power amplifiers, it is particularly required for circuit design to get the most out of a device performance.

In the circuit design of power amplifiers, it is generally recognized that both improvement of saturated output power and reliability are important issues. In order to increase the output power, it is necessary to increase a bias current of the circuit or increase a voltage amplitude. However, increasing the bias current is not desirable because a power consumption is increased. Increasing the voltage amplitude causes a large voltage amplitude between a source and a drain in the case of CMOS devices, which may exceed a specified breakdown voltage and may affect reliability. In particular, in the case of a power amplifier using an advanced CMOS process, the gate length is short and the electric field tends to be high. Therefore, deterioration of the device due to a hot carrier injection (HCI) becomes an issue.

In this way, in the power amplifier, there is a trade-off relationship between high output power and reliability. In order to solve this issue, a power amplifier may adopt a cascode connection in which a common-source transistor and a common-gate transistor are stacked. In JP 2007-135097 A, in order to increase an output and a breakdown voltage in a cascode connection circuit, a high breakdown voltage transistor that has a gate dielectric thicker than a gate dielectric of a common-source transistor of an input stage is used as a common-gate transistor of an output stage.

Therefore, the effect of the scaling law on the film thickness of the gate dielectric cannot be obtained, and the maximum available power gain (MAG) and the maximum stable power gain (MSG) may be significantly reduced. In the above-described viewpoints or in other viewpoints not mentioned, further improvements are required in semiconductor integrated circuits.

Figure 1:
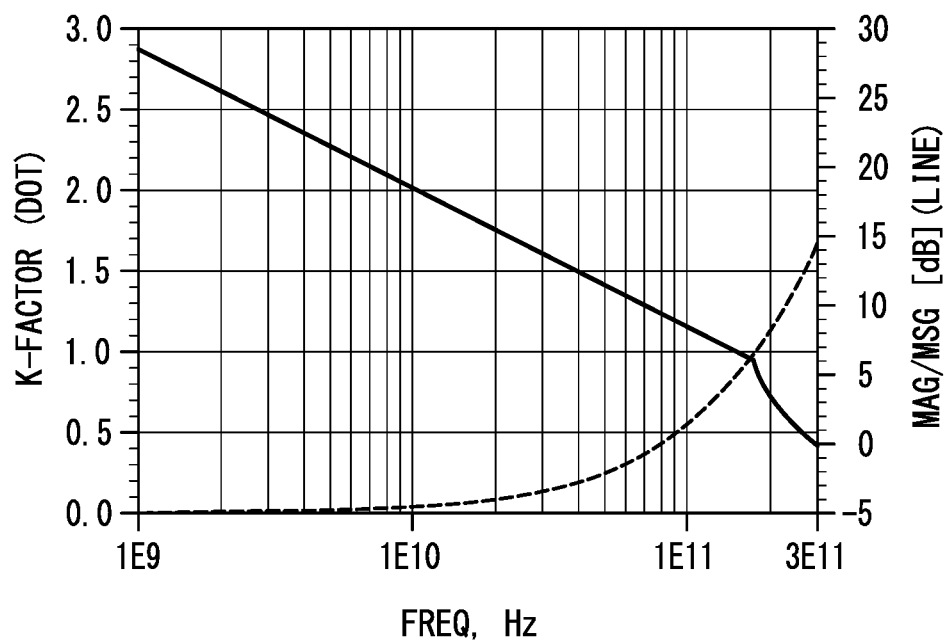
FIG. 1 is a diagram showing frequency dependence of the MAG/MSG and a K factor.

FIG. 1 shows simulation results of a frequency dependence of the MAG or the MSG, which indicates high frequency gain characteristics of a NMOS transistor, and a K factor, which indicates a stability of a circuit on condition that a process design kit (PDK) provided by a foundry is used. Here, an NMOS transistor having a gate length of 40 nm, a gate width of 1 μm, and a total gate width of 60 μm is used, and a power supply voltage of 1.1 V and a gate bias voltage of 0.7 V are applied. In the following, the MAG or the MSG may be referred to as the MAG/MSG. In FIG. 1, the solid line indicates the MAG/MSG, and the dashed line indicates the K factor. Of the solid line, a portion where K≥1 indicates the MAG, and a portion where K<1 indicates the MSG.

From FIG. 1, it is clear that the MAG/MSG decreases with increase in the frequency. Especially above 60 GHz, the MAG/MSG is below 10 dB. When used in such a high frequency band, it is important to derive the performance of the transistor in the design of the amplifier circuit.

In reality, the MAG/MSG will be lower due to the influence of the parasitic components attached to each node depending on the layout. Further, the frequency at which the K factor is 1 also shifts to the lower frequency side with increase in the influence of the parasitic components. In addition to this, it is necessary to provide an input/output impedance matching circuit in a high-frequency amplifier circuit, and since signal loss occurs in the matching circuit itself, the gain is further deteriorated by about several dB.

As described above, the transistor exhibits the performance that the MAG/MSG decreases with increase of the frequency. Therefore, in power amplifiers, it is not always optimal to use a high breakdown voltage transistor for an output stage transistor of a cascode connection.

For example, when a common-gate transistor of an output stage is a high breakdown voltage transistor in a cascode connection, the MAG/MSG is generally lowered. In particular, considering the application to radars using a quasi-millimeter wave band or a millimeter-wave band or 5G communication, this effect cannot be ignored. This is because even when a gate length and/or a total gate width are the same, the effect of the scaling law cannot be obtained with respect to the film thickness of the gate dielectric due to the relatively thickening of the gate dielectric, and the transistor performance deteriorates.

Further, when a high breakdown voltage transistor is used as the common-gate transistor of the output stage, a selectable minimum gate length is limited. In general, multiple film thicknesses can be selected as an option of a transistor provided by a foundry for manufacturing CMOS. For example, in the 40 nm generation process, transistors having different film thicknesses can be selected as products from a normal breakdown voltage transistor having a thin gate dielectric, a medium breakdown voltage transistor having a medium thickness gate dielectric, a high breakdown voltage transistor having a thick gate dielectric, and the like. A standard power supply voltage of the normal breakdown voltage transistor is 1.1 V, a standard power supply voltage of the medium breakdown voltage transistor is 1.8 V, and a standard power supply voltage of the high breakdown voltage transistor is 2.5 V.

According to the design rules, a specific example of the minimum size of the gate length that can be selected is 40 nm for the normal breakdown voltage transistor, 150 nm for the medium breakdown voltage transistor, and 270 nm for the high breakdown voltage transistor. In this way, the minimum size of the gate length is defined according to the breakdown voltage (gate dielectric thickness). Therefore, when the high breakdown voltage transistor is used, the gate length corresponding to the required reliability cannot be selected due to the limitation of the minimum size of the gate length. That is, it is difficult to optimize high frequency characteristics and the reliability for breakdown voltage.

Further, using the high breakdown voltage transistor as the common-gate transistor of the output stage is not always optimized for the issue of reliability. The reliability indicates a time dependent dielectric breakdown (TDDB), a breakdown due to a hot carrier injection (HCI), a breakdown at a PN junction, and the like in a transistor when AC operation is performed at high frequency. The breakdown of the gate dielectric by the TDDB and the fluctuation or deterioration of transistor characteristics by the HCI occur by different mechanisms. Therefore, when reliability criteria targeting the same life and the same cumulative defect rate are set, which of the TDDB and the HCI becomes an issue first may differ depending on the situation.

Specifically, when an AC signal is input to a transistor in a simulation and the operation is verified, there may be a case where the amplitude of Vgs has a margin with respect to the reliability criteria of TDDB, while the amplitude of Vds has a shortage with respect to the reliability criteria of the HCI. In such a case, it is not necessary to deal with the reliability issue of the TDDB, and only the reliability issue of the HCI needs to be dealt with. That is, it is not necessary to increase the thickness of the gate dielectric in order to increase the tolerance to the TDDB, and it is necessary to increase only the tolerance to the HCI. The high breakdown voltage transistor with the thick gate dielectric is required when the amplitude of Vgs exceeds a reference value of the reliability, and is not always required. Vgs is the voltage between the gate and the source. Vds is the voltage between the drain and the source.

However, in the techniques represented by JP 2007-135097 A, the issues of the TDDB and the HCI are not discussed separately. In addition, the amplifier is not designed quantitatively based on the reliability criteria calculated based on the failure mechanism. The issues caused when the high breakdown voltage transistor is used as the output stage transistor is not limited to the power amplifier. They are issues of semiconductor integrated circuits including a multi-stage connection unit in which multiple MOS transistors are connected in multiple stages.

A semiconductor integrated circuit according to an aspect of the present disclosure includes an input terminal, an output terminal, and a multi-stage connection unit including multiple MOS transistors connected in multiple stages between the input terminal and the output terminal. The MOS transistors include an input stage transistor connected to the input terminal and an output stage transistor connected to the output terminal. Each of the input stage transistor and the output stage transistor has a gate dielectric, and a thickness of the gate dielectric of the output stage transistor is equal to a thickness of the gate dielectric of the input stage transistor. The output stage transistor has a gate length longer than a gate length of the input stage transistor.

According to the above-described semiconductor integrated circuit, in the output stage transistor, the gate length is set to be longer than the gate length of the input stage transistor while making the thickness of the gate dielectric equal to the thickness of the gate dielectric of the input stage transistor. As a result, the breakdown voltage can be improved without causing a significant decrease in the MAG or the MSG.

Hereinafter, multiple embodiments will be described with reference to the drawings. The same reference numerals are assigned to the corresponding elements in each embodiment, and thus, duplicate descriptions may be omitted. When a part of the features in each embodiment is explained, the remaining part of the features may be provided by the features in other prior explained embodiments. Further, not only the combinations of the configurations explicitly shown in the description of the respective embodiments, but also the configurations of the multiple embodiments can be partially combined even when they are not explicitly shown as long as there is no difficulty in the combination in particular.

First Embodiment

First, a circuit configuration of a millimeter-wave radar system to which a semiconductor integrated circuit of the present embodiment is applied will be described with reference to FIG. 2.

Circuit Configuration of Millimeter-Wave Radar System

Figure 2:
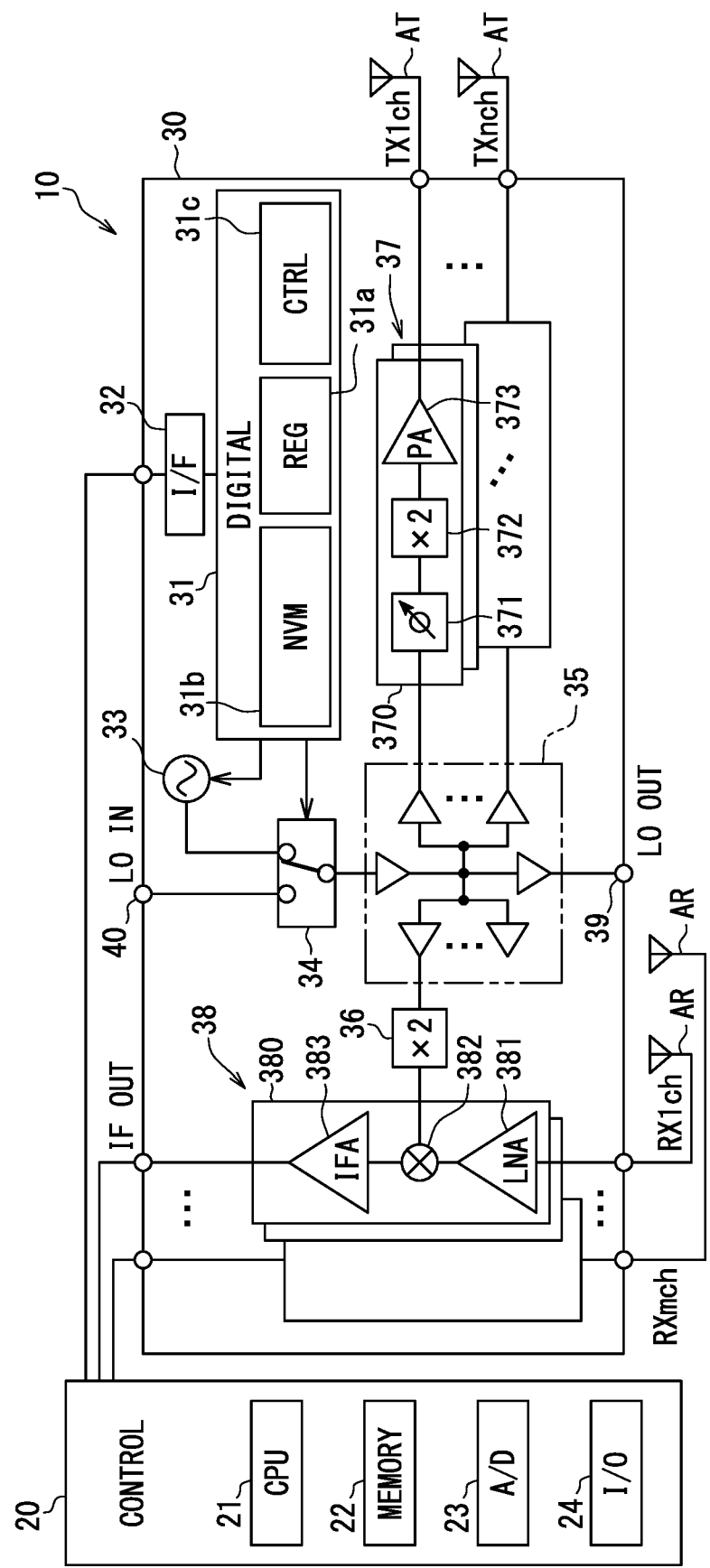
FIG. 2 is a circuit diagram showing a millimeter wave radar system according to a first embodiment.

A millimeter wave radar system 10 shown in FIG. 2 is capable of measuring a distance and a relative velocity to an object by, for example, radiating a modulated radio wave in 79 GHz band forward the vehicle and measuring a reflected wave by the object. The millimeter wave radar system 10 includes a controller 20 and a monolithic microwave integrated circuit (MMIC) 30.

The controller 20 measures the distance and the relative velocity to the object based on the input of the signal from the MMIC 30. The controller 20 is configured by using, for example, a microcomputer including a CPU 21, a memory 22 such as ROM, RAM, or the like, an analog-to-digital (A/D) converter 23, and an input-output part (I/O) 24. At least a part of the function of the controller 20 may be integrated on the MMIC 30. The present embodiment shows an example in which each function of the control system is integrated on the controller 20.

The MMIC 30 is configured by integrating each part on a single semiconductor chip made of silicon or the like. The MMIC 30 includes a digital unit 31, an interface (I/F) 32, a phase locked loop (PLL) unit 33, a high frequency switch 34, a buffer amplification unit 35, a frequency doubler 36, a transmitter unit 37, and a receiver unit 38. Further, the MMIC 30 includes an output terminal 39 for outputting a local oscillator signal to the outside and an input terminal 40 for inputting a local oscillator signal from the outside. In the following, the local oscillator signal will be referred to as an LO signal.

The digital unit 31 has a register (REG) 31a, a non-volatile memory (NVM) 31b, and a control unit (CTRL) 31c. The digital unit 31 can communicate with the outside of the MMIC 30 via the interface 32. The outside means the controller 20 or an external device (not shown). When measuring the distance and the relative speed to the object, the MMIC 30 and the controller 20 are connected.

The register 31a is a portion to which data related to switching of the high frequency switch 34, data related to gains of various amplifiers included in the buffer amplification unit 35, and the like are written. The register 31a is writable by the controller 20 or an external device via the interface 32.

The non-volatile memory 31b is a portion in which a correction value for manufacturing variation is written. The non-volatile memory 31b can be written only once. When the correction value peculiar to each chip is written to the non-volatile memory 31b, the correction value is saved without being erased.

The control unit 31c is a digital circuit, and transmits a control signal to each analog high frequency block in the chip based on the data written in the register 31a. Specifically, the control unit 31c switches the high frequency switch 34, and transmits a control signal for setting the gain to various amplifiers included in the buffer amplification unit 35. Further, the control unit 31c transmits the correction value written in the non-volatile memory 31b to each unit to be corrected. As described above, in the present embodiment, each function of the control system is integrated on the controller 20, but when at least a part of the functions is integrated on the MMIC 30, the part of the function is integrated on the digital unit 31.

The PLL unit 33 has a voltage controlled oscillator (VCO) and a feedback loop circuit (not shown). The feedback loop circuit controls an output signal of the VCO. The PLL unit 33 generates an LO signal in the 40 GHz band modulated by a method such as a frequency modulated continuous wave (FMCW), and outputs the LO signal to the high frequency switch 34.

The high frequency switch 34 switches a path by receiving the control signal from the control unit 31c based on the data written in the register 31a. When the controller 20 is connected to the MMIC 30, the control signal of the controller 20 is input via the interface 32, and data is written to the register 31a. Then, the control signal based on the data written in the register 31a is transmitted from the control unit 31c to the high frequency switch 34. As a result, the high frequency switch 34 connects the PLL unit 33 to the buffer amplification unit 35.

When an external device (not shown) is connected to the MMIC 30, the data in the register 31a is written by inputting the control signal of the external device via the interface 32. Then, the control signal based on the data written in the register 31a is transmitted from the control unit 31c to the high frequency switch 34. As a result, the high frequency switch 34 connects the input terminal 40 to the buffer amplification unit 35.

The buffer amplification unit 35 amplifies the LO signal output from the PLL unit 33 or the LO signal input from the input terminal 40 via the high frequency switch 34, and distributes the LO signal to the frequency doubler 36, the transmitter unit 37, and the output terminal 39. The buffer amplification unit 35 may be referred to as a distribution amplification unit.

The buffer amplification unit 35 has multiple amplifiers composed of high frequency amplifiers. Each amplifier amplifies the LO signal. The amplifiers arranged at the prestage and the poststage of the branch portion inside the buffer amplification unit 35 has, for example, the same circuit configuration. Each amplifier is composed of a variable gain amplifier whose gain can be changed. The setting value of the gain of each amplifier is written as the data in the register 31a and transmitted to each amplifier as the control signal from the control unit 31c. During normal radar operation, the LO signal output from the PLL unit 33 is amplified by each amplifier of the buffer amplification unit 35, and then input to the transmitter unit 37, and input to the receiver unit 38 via the frequency doubler 36.

In FIG. 2, for the sake of simplification, control lines for transmitting various control signals are not shown. The number of amplifiers included in the buffer amplification unit 35 is optional. For example, although the example in which two amplifiers are provided in the path from the input terminal 40 to the output terminal 39 is shown, one amplifier may be provided, or three or more amplifiers may be provided.

The frequency doubler 36 doubles the frequency of the LO signal transmitted from the buffer amplification unit 35, and transmits the converted LO signal to the receiver unit 38. The frequency doubler 36 may be referred to as a frequency multiplier.

The transmitter unit 37 has multiple transmitters 370. The transmitters 370 are provided for respective transmitter channels. The transmitter unit 37 of the present embodiment includes transmitter channels TX1ch to TXnch for n channels. Each of the transmitters 370 has a phase shifter 371, a frequency doubler 372, and a power amplifier 373. The phase shifter 371, the frequency doubler 372, and the power amplifier 373 are connected in cascade.

The phase shifter 371 controls the phase of the corresponding one of the transmitter channels TX1ch to TXnch. The phase shifter 371 may be provided at the prestage of the frequency doubler 372 or the poststage of the frequency doubler 372. In the present embodiment, the phase shifter 371 is provided at the prestage of the frequency doubler 372.

The frequency doubler 372 doubles the frequency of the signal input from the phase shifter 371 and outputs it to the power amplifier 373. Instead of the frequency doubler 372, another frequency multiplier, for example a frequency tripler that outputs a frequency three times the input signal frequency, can be used. The power amplifier 373 amplifies the power of the high frequency signal that has passed through the phase shifter 371 and the frequency doubler 372.

The output of the transmitter 370 in each transmitter channel TX1ch to TXnch is connected to a feeding point of a corresponding antenna element AT formed on a printed circuit board (not shown). Then, the high frequency signal transmitted from the transmitter 370 in each transmitter channel TX1ch to TXnch is finally radiated toward the object as a radio wave modulated through the antenna element AT.

The receiver unit 38 has multiple receivers 380. The receivers 380 are provided for respective receiver channels. The receiver unit 38 of the present embodiment includes receiver channels RX1ch to RXmch for m channels. The number of receiver channels m may be the same as or different from the number of transmitter channels n. Each of the receivers 380 has a low noise amplifier (LNA) 381, a mixer 382, and an intermediate frequency amplifier (IFA) 383. The receivers 380 are connected to the antenna elements AR of the corresponding receiving channels RX1ch to RXmch.

A reflected wave reflected from the object is input to the receivers 380 via the antenna elements AR. The LNA 381 of each of the receivers 380 amplifies the received signal input via the corresponding antenna element AR and outputs it to the mixer 382. The mixer 382 converts the received signal into a lower intermediate frequency by the LO signal whose frequency is doubled by the frequency doubler 36.

The IFA 383 is composed of, for example, a variable gain amplifier. The IFA 383 amplifies the signal transmitted from the mixer 382 according to the set value set in the register 31a, and outputs the signal to the A/D converter 23 of the controller 20. The controller 20 calculates the distance to the object and the relative speed by executing signal processing based on the digital data converted by the A/D converter 23.

The configuration in which the millimeter wave radar system 10 includes only one MMIC 30 has been described, but the present disclosure is not limited to this configuration. The millimeter wave radar system 10 may include multiple MMICs 30. For example, in a configuration including two MMICs 30, one chip may be operated as a master and the other chip may be operated as a slave. Specifically, only the PLL unit 33 of one chip may be oscillated, the generated LO signal may be output from the output terminal 39, and may be input from the input terminal 40 of the other chip. As a result, the transmitter channel and the receiver channel of the millimeter wave radar system 10 can be increased, and the performance of the millimeter wave radar system 10 can be improved.

Circuit Configuration of Semiconductor Integrated Circuit

Next, the circuit configuration of the semiconductor integrated circuit will be described with reference to FIG. 3. The semiconductor integrated circuit has a multi-stage connection unit in which multiple metal oxide semiconductor field effect transistors (MOSFETs) are connected in multiple stages. In the present embodiment, an example in which the semiconductor integrated circuit is applied to the buffer amplification unit 35 is shown.

As shown in FIG. 2, the buffer amplification unit 35 configured by the semiconductor integrated circuit distributes the LO signal in the 40 GHz band to the transmitter unit 37 and the receiver unit 38 in the MMIC 30 used in the 79 GHz band. The LO signal generated in the 40 GHz band by the PLL unit 33 is distributed to the frequency doubler 372 on the transmitter unit 37 side and the frequency doubler 36 on the receiver unit 38 side via the buffer amplification unit 35.

Since it is necessary to input high power to the frequency doublers 36 and 372, the buffer amplification unit 35 (semiconductor integrated circuit) is required to have high output power as required for the power amplifier. Further, since the buffer amplification unit 35 (semiconductor integrated circuit) has a role of distributing the reference signal to the multiple channels included in the transmitter unit 37 and the receiver unit 38, the buffer amplification unit 35 may operate in a region where the output power is saturated. Therefore, high reliability is required for operating life deterioration such as the HCI, the TDDB specified in AEC-Q100 and the like. AEC is an abbreviation for Automotive Electronics Council. Q100 is a category of integrated circuits.

Figure 3:
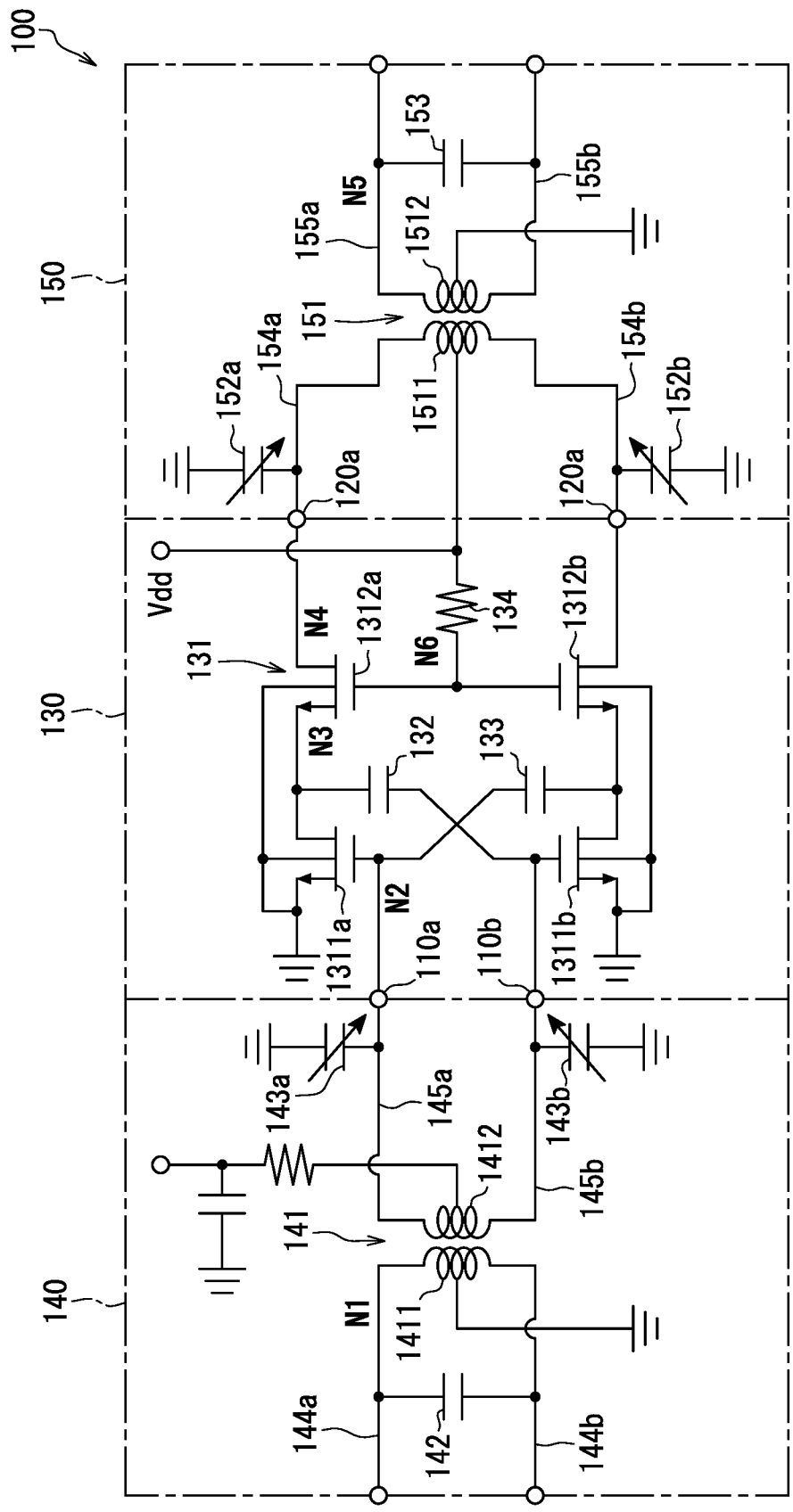
FIG. 3 is a circuit diagram showing a semiconductor integrated circuit.

As shown in FIG. 3, the semiconductor integrated circuit 100 includes input terminals 110a and 110b, output terminals 120a and 120b, a multi-stage connection unit 130, an input matching circuit 140, and an output matching circuit 150. As described above, the semiconductor integrated circuit 100 is a part of the MMIC 30. That is, the semiconductor integrated circuit 100 is configured in a single semiconductor chip made of silicon or the like.

The multi-stage connection unit 130 is provided between the pair of input terminals 110a and 110b and the pair of output terminals 120a and 120b. The multi-stage connection unit 130 of the present embodiment forms a differential amplifier circuit. Details of the multi-stage connection unit 130 will be described later.

The input matching circuit 140 and the output matching circuit 150 each have a transformer and a capacitance, and are matched to frequencies in the 40 GHz band. Specifically, the input matching circuit 140 has a first transformer 141, a fixed capacitance 142, and variable capacitances 143a and 143b. The first transformer 141 has a primary winding 1411 and a secondary winding 1412. In the present embodiment, the winding number ratio of the primary winding 1411 and the secondary winding 1412 is 1:2. The fixed capacitance 142 is connected between signal lines 144a and 144b connected to the primary winding 1411. The signal lines 144a and 144b are paired differential signal lines.

The variable capacitances 143a and 143b are connected between signal lines 145a and 145b connected to the secondary winding 1412 and the ground, respectively. The signal lines 144a and 144b are paired differential signal lines. The signal line 145a is connected to the input terminal 110a, and the signal line 145b is connected to the input terminal 110b. The first transformer 141 of the present embodiment is a center tap type transformer. The primary winding 1411 is grounded, and a predetermined bias voltage (for example, about 0.7 V) lower than a power supply voltage Vdd is applied to the secondary winding 1412.

The output matching circuit 150 has a second transformer 151, variable capacitances 152a and 152b, and a fixed capacitance 153. The second transformer 151 has a primary winding 1511 and a secondary winding 1512. In the present embodiment, the winding number ratio of the primary winding 1511 and the secondary winding 1512 is 2:1. The variable capacitances 152a and 152b are connected between signal lines 154a and 154b connected to the primary winding 1511 and the ground, respectively. The signal lines 154a and 154b are paired differential signal lines. The signal line 154a is connected to the output terminal 120a, and the signal line 154b is connected to the output terminal 120b. The fixed capacitance 153 is connected between signal lines 155a and 155b connected to the secondary winding 1512. The signal lines 155a and 155b are paired differential signal lines.

The second transformer 151 is also a center tap type transformer. The secondary winding 1512 is grounded, and the power supply voltage Vdd is applied to the primary winding 1511. The above-mentioned signal lines 144a, 145a, 154a, and 155a may be referred to as, for example, positive phase signal lines. In this case, the signal lines 144b, 145b, 154b, and 155b are referred to as reverse phase signal lines.

The capacitances of the matching circuits are not limited to the above examples. For example, the fixed capacitance may be replaced with a variable capacitance, or the variable capacitance may be replaced with a fixed capacitance. A part of the capacitance may be excluded. The winding number ratio of the transformer is not limited to the above example. Instead of the matching circuit having a transformer and a capacitance, a matching circuit using another inductor or a transmission line may be adopted.

Circuit Configuration of Multi-Stage Connection

Figure 4:
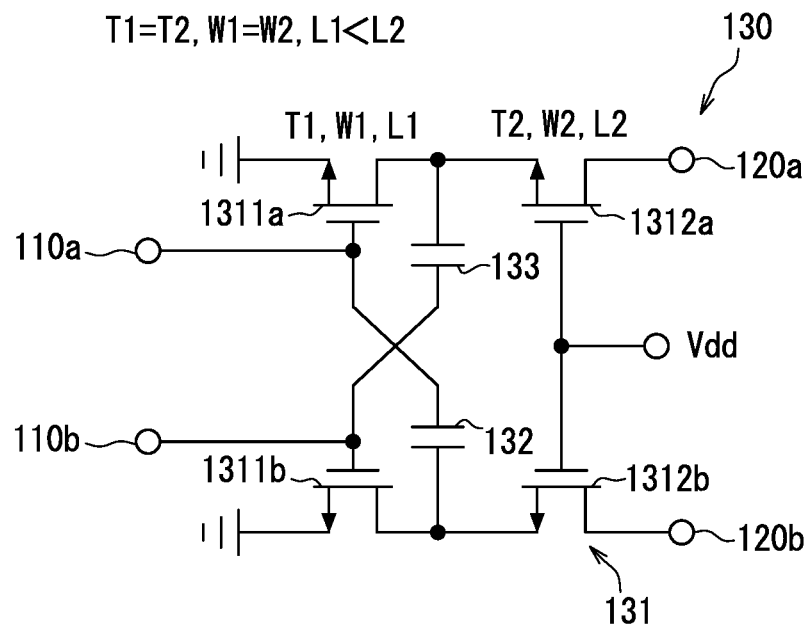
FIG. 4 is a circuit diagram showing a multi-stage connection unit.

Next, the circuit configuration of the multi-stage connection unit will be described with reference to FIGS. 3 and 4. In FIG. 4, a gate resistor 134 on the output stage side is omitted.

As shown in FIGS. 3 and 4, the multi-stage connection unit 130 has multiple MOS transistors 131. The MOS transistors 131 are connected in multiple stages between the input terminals 110a and 110b and the output terminals 120a and 120b. Specifically, the multi-stage connection unit 130 has a two-stage structure. The MOS transistors 131 include input stage transistors 1311a and 1311b and output stage transistors 1312a and 1312b. The input stage may be referred to as a lower stage, and the output stage may be referred to as an upper stage. The input stage transistors 1311a and 1311b are common-source transistors whose sources are connected to the ground (GND). The output stage transistors 1312a and 1312b are common-gate transistors whose gates are connected to the power supply voltage.

The common-source input stage transistor 1311a and the common-gate output stage transistor 1312a are cascode-connected. Similarly, the common-source input stage transistor 1311b and the common-gate output stage transistor 1312b are cascode-connected. As described above, the multi-stage connection unit 130 is a cascode connection unit including the multiple MOS transistors 131.

Specifically, the gate of the input stage transistor 1311a is connected to the input terminal 110a, and the gate of the input stage transistor 1311b is connected to the input terminal 110b. The sources of the input stage transistors 1311a and 1311b are grounded, respectively. The drain of the output stage transistor 1312a is connected to the output terminal 120a, and the drain of the output stage transistor 1312b is connected to the output terminal 120b. The drain of the input stage transistor 1311a and the source of the output stage transistor 1312a are connected to each other. The drain of the input stage transistor 1311b and the source of the output stage transistor 1312b are connected to each other.

The multi-stage connection unit 130 further has neutralization capacities 132 and 133. The neutralization capacitance 132 is connected between the gate of the input stage transistor 1311a and the drain of the input stage transistor 1311b. The neutralization capacitance 133 is connected between the gate of the input stage transistor 1311b and the drain of the input stage transistor 1311a. In this way, the multi-stage connection unit 130 is cross-coupled. The value of the neutralization capacitance 132 is set to be substantially equal to the value of a parasitic capacitance Cgd between the gate of the input stage transistor 1311a and the drain of the input stage transistor 1311b. Similarly, the value of the neutralization capacitance 133 is set to be substantially equal to the value of a parasitic capacitance Cgd between the gate of the input stage transistor 1311b and the drain of the input stage transistor 1311a. It should be noted that "substantially equal" is not limited to perfect matching, but allows a deviation of the degree of manufacturing variation.

Since the multi-stage connection unit 130 operates in a high frequency band of the 40 GHz band, the MAG/MSG is low in the case of a cascode connection without a neutralization capacitance. In the present embodiment, since the gate of one of the input stage transistors 1311a and 1311b, which form a differential pair, and the drain of the other of the input stage transistors 1311a and 1311b are cross-coupled by the neutralization capacitances 132 and 133, the deterioration of the high frequency characteristics due to the parasitic capacitance Cgd can be reduced. Further, even when the input/output impedance of the multi-stage connection unit 130 changes, the K factor can be stabilized.

Structure of MOS Transistor

Next, the structure of the MOS transistor will be described. In the present embodiment, the MMIC 30 including the semiconductor integrated circuit 100 is formed by using a 40 nm generation bulk CMOS semiconductor process. This process provides multiple transistors having different gate dielectric thicknesses. The gate dielectric is usually provided as an oxide film.

Specifically, as described above, transistors having different film thicknesses can be selected from a normal breakdown voltage transistor, a medium breakdown voltage transistor, a high breakdown voltage transistor, and the like. The normal breakdown voltage transistor is a transistor having a thin gate dielectric and having a standard power supply voltage of 1.1 V. The medium breakdown voltage transistor is a transistor having a medium thickness gate dielectric and having a standard power supply voltage of 1.8 V. The high breakdown voltage transistor is a transistor having a thick gate dielectric and having a standard power supply voltage of 2.5 V. The minimum gate length that can be selected by the design rule is 40 nm for the 1.1 V transistor, 150 nm for the 1.8 V transistor, and 270 nm for the 2.5 V transistor. The standard power supply voltage refers the value of the power supply voltage applied during normal operation specified in the design manual, PDK, or the like. Specifically, the standard power supply voltage is the value of the power supply voltage labeled as 1.1V transistor, 1.5V transistor, 1.8V transistor, 2.5V transistor, 3.3V transistor, and the like.

In the present embodiment, the normal breakdown voltage transistor (1.1V transistor) capable of selecting the minimum gate length provided by the process is used as all the MOS transistors 131 included in the multi-stage connection unit 130. Further, as an example, the gate width is set to 1 μm, the number of fingers is set to 60, and the total gate width is set to 60 μm for all the MOS transistors 131.

On the other hand, the gate length is different between the common-source input stage transistors 1311a and 1311b and the common-gate output stage transistors 1312a and 1312b. Specifically, the gate length of the input stage transistors 1311a and 1311b is set to 40 nm, which is the minimum in the normal breakdown voltage transistor. The gate length of the output stage transistors 1312a and 1312b is set to 80 nm, which is longer than the minimum value of 40 nm specified by the design rules.

A shown in FIG. 4, in each of the input stage transistors 1311a and 1311b, the thickness of the gate dielectric is defined as T1, the total gate width is defined as W1, and the gate length is defined as L1. Further, in each of the output stage transistors 1312a and 1312b, the thickness of the gate dielectric is defined as T2, the total gate width is defined as W2, and the gate length is defined as L2. In the present embodiment, the input stage transistors 1311a and 1311b and the output stage transistors 1312a and 1312b in the multi-stage connection unit 130 satisfy the relationship of T1=T2, W1=W2, and L1<L2.

The gate length of the MOS transistor 131 in each of the input stage and the output stage of the multi-stage connection unit 130 is not limited to the above example. As will be described later, the gate length may be determined according to the voltage amplitude between the source and the drain of the MOS transistors 131 in each stage.

Method of Setting Gate Length

Next, a method of setting the gate length will be described with reference to FIG. 5A to FIG. 5F and FIG. 6. First, the transient response of the voltage amplitude at each node and between the nodes when a high frequency signal is input to the multi-stage connection unit will be described.

FIG. 5A to FIG. 5F show the voltage amplitude at each node or between the nodes in the semiconductor integrated circuit 100 having the circuit configuration shown in FIG. 3, when the input voltage is changed from −10 dBm to 0 dBm in 2 dB steps at 40 GHz and is input to the input terminal of the input matching circuit 140. However, as an initial condition in the simulation, the gate length of the output stage transistors 1312a and 1312b is set to a value equal to the gate length of the input stage transistors 1311a and 1311b, specifically 40 nm. That is, the simulation result of FIG. 5A to FIG. 5F is the result of a reference example in which the gate length of the output stage transistors is different from that of the present embodiment in the circuit configuration equivalent to that of the present embodiment.

As shown in FIG. 3, a node N1 is provided on the signal line on the primary side of the first transformer. A node N2 is provided between the gate of the input stage transistor and the secondary winding of the first transformer. A node N3 is provided between the drain of the input stage transistor and the source of the output stage transistor. A node N4 is provided between the drain of the output stage transistor and the primary winding of the second transformer. A node N5 is provided on a signal line on the secondary side of the second transformer. A node N6 is a connection point between the gate of the output stage transistor on the positive phase side and the gate of the output stage transistor on the reverse phase side. FIG. 5A to FIG. 5F show six voltage amplitudes at the node N1, at the node N2, at the node N3, between the nodes N4 and N3, between the nodes N4 and N6, and at the node N5, respectively. In the differential configuration, the solid line shows the voltage amplitude on the positive phase side, and the broken line shows the voltage amplitude on the reverse phase side. For the normal breakdown voltage 1.1 V transistor that uses the thin gate dielectric, it is usually regulated by a design rule provided by a foundry or the like that the circuit is operated by applying the standard power supply voltage of 1.1 V. On the other hand, the allowable voltage depends on the target of the lifetime of the semiconductor product, the product defect rate, and the operating temperature, and a voltage higher than the standard power supply voltage of 1.1 V is allowed.

As an example of the calculated allowable voltage when conditions of the lifetime, the product defect rate, and the operating temperature described above are taken into consideration with respect to the voltage amplitude simulation result of FIG. 5A to FIG. 5F, the allowable voltage for the HCI of a transistor having a gate length of 40 nm, that is, the allowable voltage Vds between the source and the drain is set to 1.25 V. Further, the allowable voltage with respect to the TDDB, that is, the allowable voltage Vgs between the gate and the source is set to 1.5 V. As described above, the TDDB may have a margin in voltage amplitude more than the HCI with respect to the same conditions of the lifetime of the semiconductor product, the product defect rate, and the operating temperature. The allowable voltage differs between the TDDB and the HCI for the same target operating time failure rate because deterioration occurs by different mechanisms. The allowable voltage for the HCI and the allowable voltage for the TDDB described above are merely examples. Note that these allowable voltage values depend on the target product life, Si junction temperature, circuit configuration, and the like.

The voltage amplitude at the node N3 indicates the amplitude of the voltage Vds between the source and the drain of the input stage transistors. As shown in FIG. 5C, the voltage Vds of the input stage (lower stage) is about 0.7 V even at the maximum input of 0 dBm, and does not exceed the allowable voltage of 1.25 V with respect to the HCI. Therefore, the input stage transistors satisfy the reliability criteria of the HCI.

The voltage amplitude between the nodes N4-N3 indicates the amplitude of the voltage Vds between the source and drain of the output stage transistors. As shown in FIG. 5D, the voltage Vds of the output stage (upper stage) is about 1.4 V at the maximum input of 0 dBm, and exceeds the allowable voltage of 1.25 V. Therefore, the output stage transistors do not satisfy the reliability criteria of the HCI.

The voltage amplitude at the node N2 indicates the amplitude of the voltage Vgs between the gate and the source of the input stage transistors. As shown in FIG. 5B, the voltage Vgs of the input stage is about 1.1 V at the maximum input of 0 dBm, and does not exceed the allowable voltage of 1.5 V with respect to the TDDB. Therefore, the input stage transistors satisfy the reliability criteria of the TDDB.

Although not shown, the voltage at the node N6 is transiently constant because the gates of the output stage transistors are grounded at a high frequency, the fluctuation of the voltage Vgs of the output stage is small, and the voltage Vgs of the output stage does not exceed 1.5 V. Similarly, the voltage amplitude between the nodes N4-N6 shown in FIG. 5E indicates the amplitude of the voltage Vdg between the gate and the drain of the output stage transistors.

The voltage Vdg of the output stage (upper stage) is about 1.0 V at the maximum input of 0 dBm, and does not exceed the allowable voltage of 1.5 V. Therefore, the output stage transistors also satisfy the reliability criteria of the TDDB. From the viewpoint of the TDDB, it is clear that it is not necessary to use a high breakdown voltage transistor having a thick gate dielectric as the output stage transistors.

From the above, it is clear that in the multi-stage connection unit 130, the amplitude of the voltage Vds between the source and the drain of the output stage transistors is most likely to be an issue in terms of reliability. In the case of an amplifier in which the multi-stage connection unit 130 has a cascode connection as in the present embodiment, the signal amplified by the input stage transistors is input to the output stage transistors, so that the voltage Vds of the output stage transistor becomes an issue in terms of reliability.

Figure 5A:
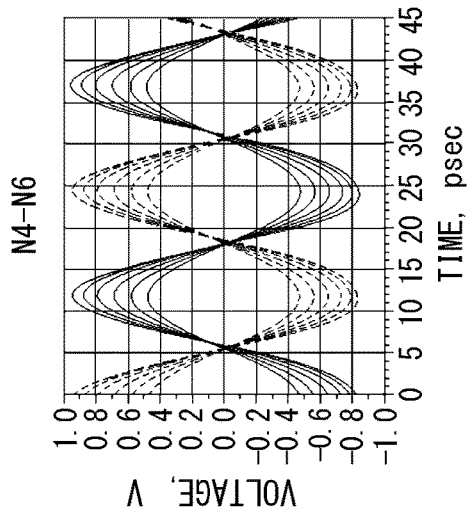
FIG. 5A to FIG. 5F are diagrams showing voltage amplitudes at respective nodes or between nodes.
Figure 5C:
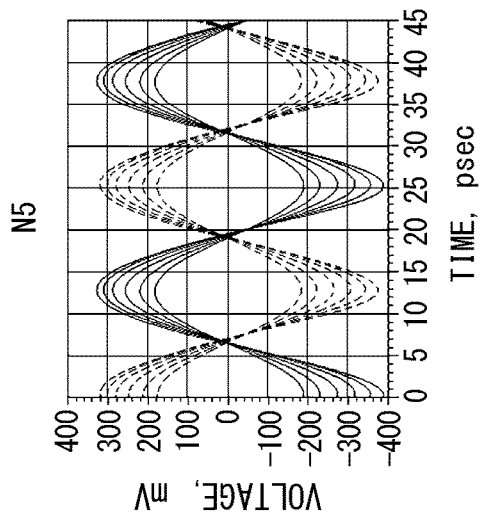
Figure 5E:
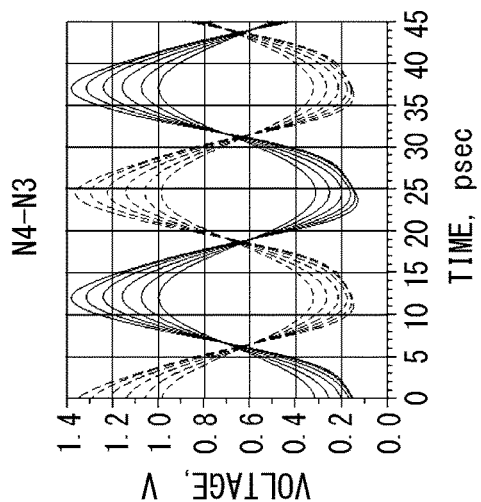
Figure 5B:
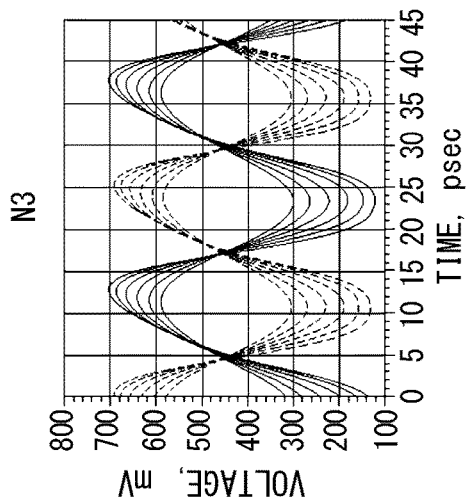
Figure 5D:
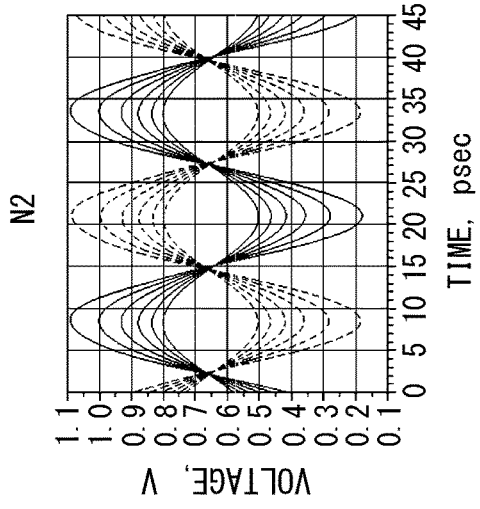
Figure 5F:
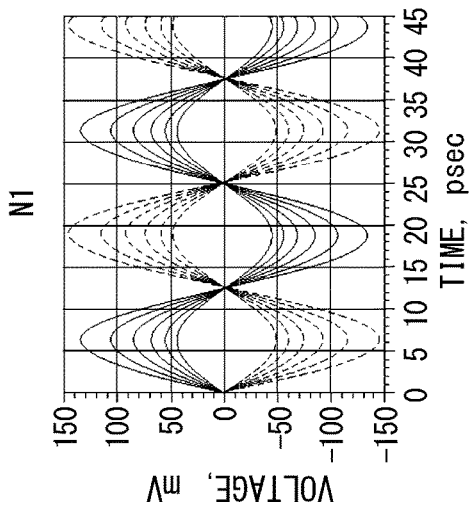

As shown in FIG. 5A and FIG. 5B, the amplitude at the node N2 on the secondary side is larger than the amplitude at the node N1 on the primary side. This is because the transformer having the winding number ratio of 1:2 is used, and an electric power is conserved. The amplitude ratio can be changed by the winding number ratio. The same applies to the output matching circuit 150.

From the simulation results in FIG. 5A to FIG. 5F, it is shown that the allowable voltage between the source and the drain of the output stage transistors is insufficient. Next, the dependence of the allowable voltage on the gate length will be described.

Figure 6:
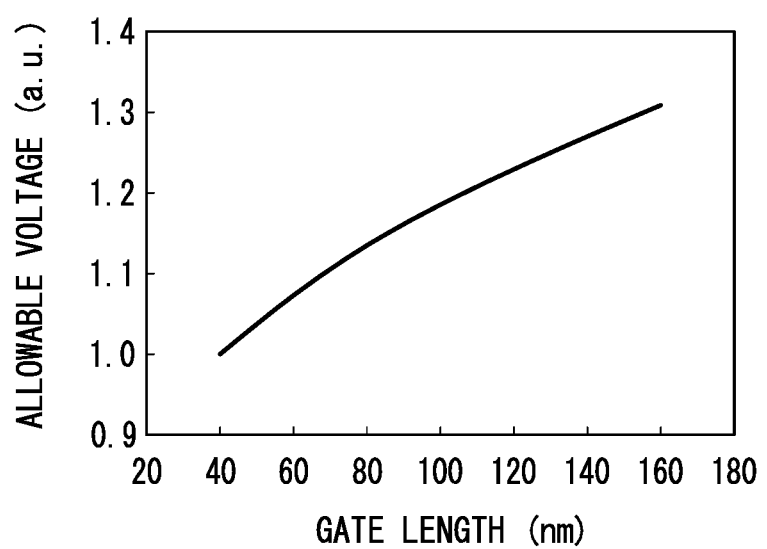
FIG. 6 is a diagram showing a relationship between a gate length and an allowable voltage.

The degree of deterioration due to the HCI with respect to the gate length of the MOS transistor, that is, the allowable voltage can be calculated by performing a reliability test using a test element group (TEG) circuit. FIG. 6 shows the relationship between the gate length and the allowable voltage in the normal breakdown voltage transistor. In FIG. 6, the allowable voltage at the gate length of 40 nm is normalized to 1.

As described above, the voltage Vds of the output stage transistors is about 1.4 V at the maximum input of 0 dBm. As shown in FIG. 6, when the gate length is set to 80 nm, the allowable voltage increases to about 1.41 V, which is 1.13 times from 1.25 V when the gate length is 40 nm. As described above, when the gate length of the output stage transistors is set to 80 nm, the reliability criteria of the HCI can be satisfied. From this relationship, the gate length L2 of the output stage transistors 1312a and 1312b of the present embodiment is set to 80 nm.

Here, in the actual design, after setting the gate length of the output stage transistors to 80 nm, the simulation of FIG. 5A to FIG. 5F is performed, and it is confirmed whether the voltage amplitudes at the respective nodes or between the nodes are within the allowable voltage. Although the setting of the gate length of the output stage transistors has been described, the gate length of other MOS transistors can also be determined based on the relationship with the allowable voltage shown in FIG. 6.

Effect of Gate Length on MAG/MSG

Next, the relationship between the gate length and the MAG/MSG will be described with reference to FIG. 7A to FIG. 7D and FIG. 8. That is, the influence of the gate length on the MAG/MSG will be described.

FIG. 7A to FIG. 7D show the simulation results of the dependence of the MAG/MSG and the K factor on the neutralization capacitance for the multi-stage connection unit 130. In FIG. 7A to FIG. 7D, Cneu on the horizontal axis indicates the value of the neutralization capacitance. The sharp peak side shows the K factor. In this simulation, the gate lengths of the output stage transistors 1312a and 1321b are changed to 40 nm, 80 nm, 120 nm and 160 nm while the gate lengths of the input stage transistors 1311a and 1311b are fixed at 40 nm. The solid line is 40 nm, the dashed line is 80 nm, the long dashed short dashed line is 120 nm, and the long dashed double-short dashed line is 160 nm. The total gate width is 60 μm for both. The bias conditions are 0.7 V for the input terminals 110a and 110b shown in FIG. 4, 1.1 V for the output terminals 120a and 120b, and 1.1 V for the power supply voltage Vdd. That is, a bias of 0.7 V is applied to the gates of the input stage transistors 1311a and 1311b, and a bias of 1.1 V is applied to the gate and the drain of the output stage transistors 1312a and 1321b, respectively.

Figure 7A:
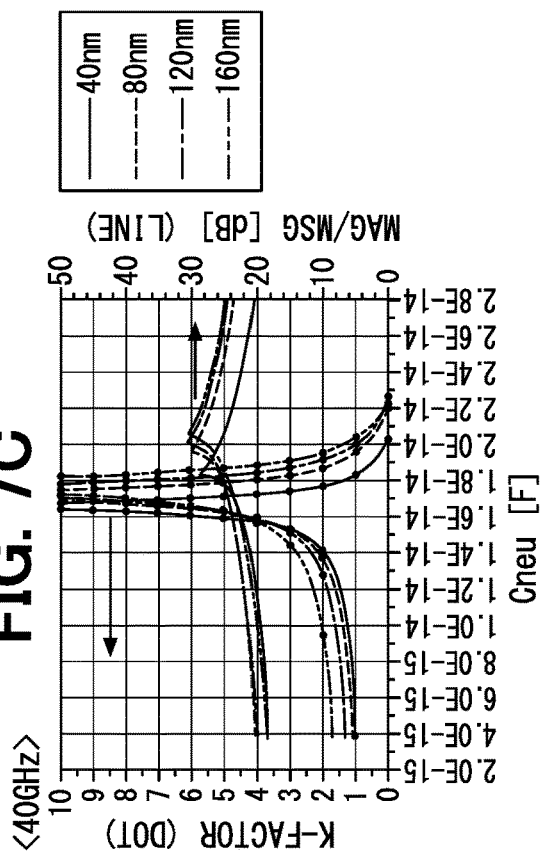
FIG. 7A to FIG. 7D are diagrams showing the effect of the gate length on the MAG/MSG and the K factor.
Figure 7B:
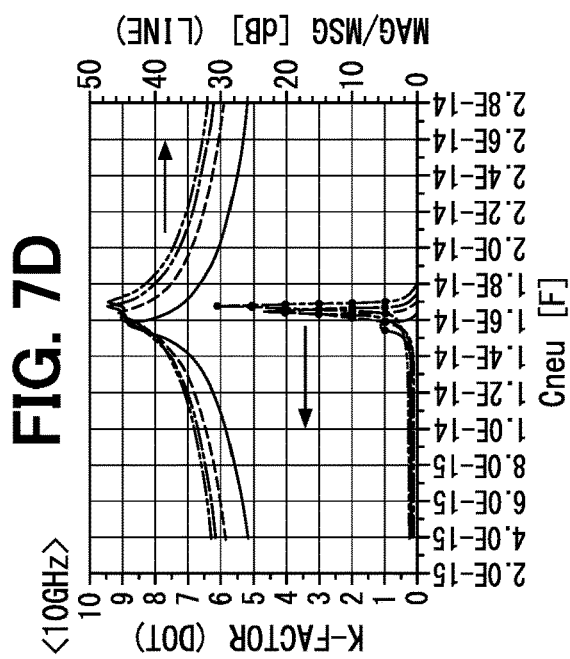
Figure 7C:
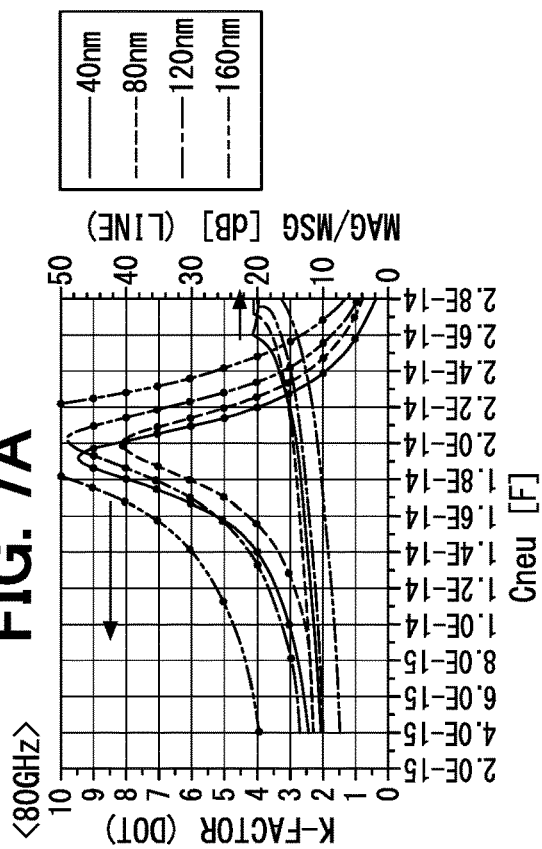
Figure 7D:
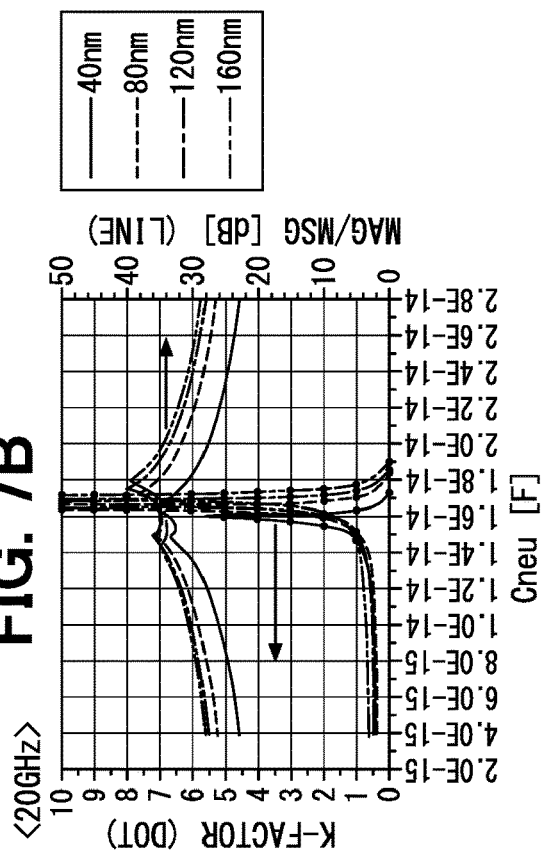

High frequency amplifiers are usually used in the range of K factor 1 or more in order to ensure stability against abnormal oscillation. It is more preferable to use the high frequency amplifiers near the peak value of the K factor. As shown in FIG. 7C, for example, in the 40 GHz band, even if the gate length of the output stage transistors is increased from 40 nm to 80 nm, 120 nm, and 160 nm, almost no deterioration of the MAG/MSG is observed in the range where the K factor is 1 or more. As shown in FIG. 7A, in the 80 GHz band, even if the gate length is increased from 40 nm to 120 nm, almost no deterioration of the MAG/MSG is observed in the range where the K factor is 1 or more.

It should be noted that the MAG/MSG is not always unchanged due to fluctuations in the gate length of the output stage transistor. By changing the input impedance according to the gate length, the MAG/MSG at the multi-stage connection unit 130 also changes. For example, in the 40 GHz band graph of FIG. 7C, when the gate length of the output stage transistors changes from 40 nm to 80 nm, the MAG/MSG changes by about 1 dB in the region where the K factor is 1 or more.

Figure 8:
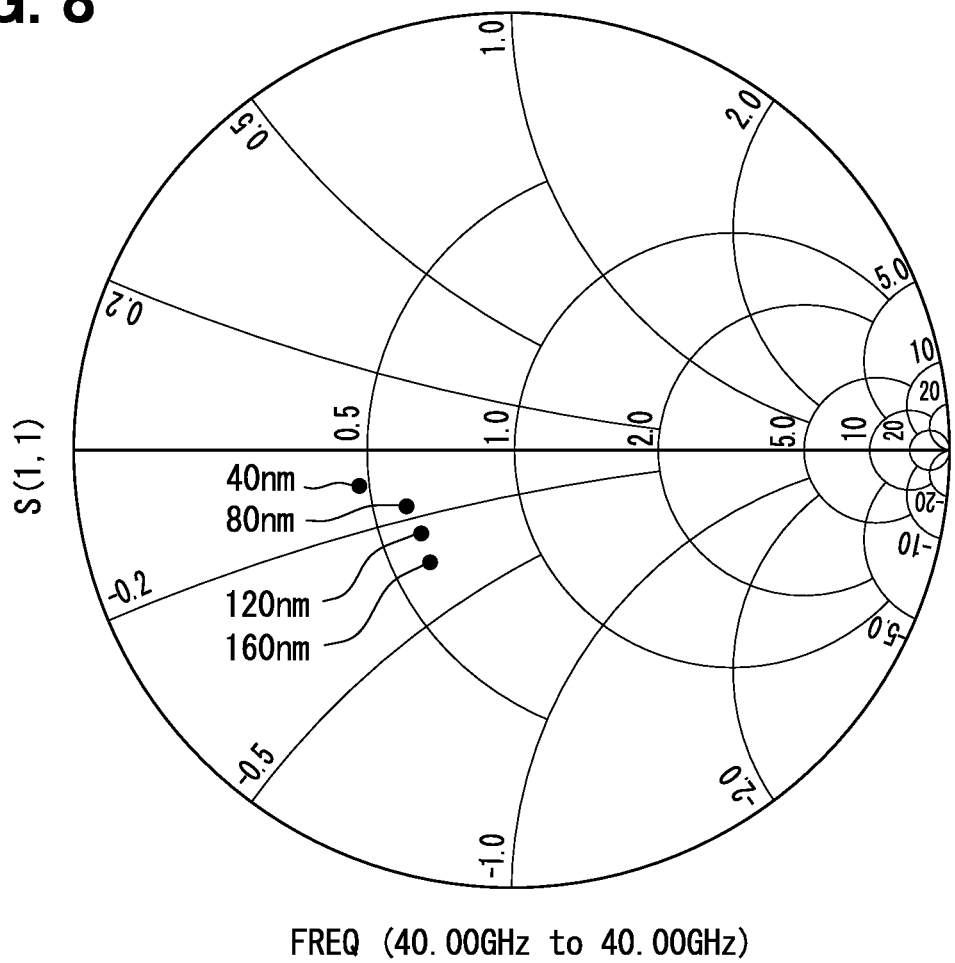
FIG. 8 is a diagram showing a gate length dependence of an input impedance of an output stage transistor.

FIG. 8 shows the input impedance of the output stage transistor as seen from the source terminal side. Here, the total gate width is 60 μm, and the gate length is changed from 40 nm to 160 nm. From the Smith chart of FIG. 8, it can be read that the series resistance component increases with increase in the gate length, and the parallel parasitic capacitance increases with increase in the gate length.

What is essentially important is not the increase/decrease (fluctuation) of the MAG/MSG due to the increase in the gate length shown in FIG. 7A to FIG. 7D, but the increase in the gate length improving the breakdown voltage between the source and the drain of the output stage transistors as compared with the case where the same gate length is used, as shown in FIG. 6. The input impedance of the output stage transistor changes due to the change in the gate length, and the MAG/MSG increases or decreases. However, even if the MAG/MSG decreases, the effect of improving the breakdown voltage does not disappear.

Summary of First Embodiment

In the present embodiment, the input stage transistors 1311a and 1311b and the output stage transistors 1312a and 1312b included in the multi-stage connection unit 130 use transistors of the same breakdown voltage version. That is, the film thickness T2 of the gate dielectric of the output stage transistors 1312a and 1312b is equal to the film thickness T1 of the gate dielectric of the input stage transistors 1311a and 1311b. As a result, it can be suppressed that the effect of the scaling law cannot be obtained and the MAG/MSG decreases due to adaptation of the output stage transistors 1312a and 1312b having a higher breakdown voltage than the input stage transistors 1311a and 1311b. This effect is more remarkable when considering application at high operating frequencies such as millimeter-wave radar and 5G communication.

Further, after satisfying the relationship of T1=T2 for the gate dielectric, the input stage transistors 1311a and 1311b and the output stage transistors 1312a and 1312b satisfy the relationship of L1<L2 for the gate length. As described above, as the gate length of the output stage transistors 1312a and 1312b, a gate length longer than 40 nm, for example, 80 nm, is selected according to the voltage amplitude without using the minimum size of 40 nm. Accordingly, the breakdown voltage can be improved without causing a significant decrease in the MAG/MSG. In particular, the breakdown voltage due to the HCI can be improved. As a result, it becomes possible to achieve high output power and high power addition efficiency under the same circuit current as the entire amplifier including the multi-stage connection unit 130.

When medium breakdown voltage transistors or a high breakdown voltage transistors are used as the output stage transistors instead of the normal breakdown voltage transistors in order to improve the breakdown voltage, since the minimum gate length that can be selected is 150 nm for the medium breakdown voltage transistors and 270 nm for the high breakdown voltage transistors, a gate length shorter than that cannot be selected. On the other hand, in the present embodiment, any gate length can be selected according to the voltage amplitude based on the relationship between the gate length and the allowable voltage shown in FIG. 6. Since the gate length can be selected according to the required reliability criteria, the breakdown voltage to the HCI can be optimized without causing a significant decrease in the MAG/MSG.

In the present embodiment, it is not necessary to manufacture multiple types of transistors having different gate dielectric thicknesses in order to form the multi-stage connection unit 130. As a result, an additional mask can be eliminated, the manufacturing process can be simplified, and the manufacturing cost can be reduced.

In the present embodiment, an example is shown in which the multi-stage connection unit 130 has the two-stage cascode connection portion having the common-source input stage transistors 1311a and 1311b and the common-gate output stage transistors 1312a and 1312b. However, the multi-stage connection unit 130 may be provided with multi-stage common-gate transistors. That is, the number of stages of the multi-stage connection unit 130 may be three or more. In the case of three or more stages, at least one common-gate intermediate stage transistor is provided between the common-source input stage transistor and the common-gate output stage transistor. Even in the multi-stage connection unit 130 having three or more stages, when at least the input stage transistor and the output stage transistor satisfy the relationship of T1=T2 and L1<L2, the breakdown voltage can be improved without significant decrease of the MAG/MSG.

For example, in the case of the multi-stage connection unit 130 having a three-stage structure, one stage of a common-gate intermediate stage transistor is provided between the common-source input stage transistor and the common-gate output stage transistor. In this case, the film thickness T3 of the gate dielectric of the intermediate stage transistor is substantially equal to the film thickness T1 of the input stage transistor and the film thickness T2 of the output stage transistor. The gate length L3 of the intermediate stage transistor may be equal to, for example, the gate length L1 of the input stage transistor, or may be shorter than the gate length L1. The length may be between the gate length L2 of the output stage transistor and the gate length L1. Preferably, the gate length L3 may be determined based on the relationship between the gate length and the allowable voltage described above. In this way, by selecting the gate length according to the voltage amplitude in each stage, it becomes possible to configure the MOS transistors in all stages with transistors of the same breakdown voltage version. Therefore, the manufacturing process can be simplified and the manufacturing cost can be reduced.

In the present embodiment, the example in which the multi-stage connection unit 130 is the cascode connection unit having the common-source transistors as the input stage transistors and the common-gate transistor as the output stage transistors has been described. However, the multi-stage connection is not limited to the cascode connection. The input stage transistor is not limited to the common-source transistor. The output stage transistor is not limited to the common-gate transistor. Further, the configuration in which multiple MOS transistors 131 are connected in multiple stages is not limited to the cascaded connection. The multi-stage connection unit 130 may have, for example, an impedance matching circuit (element) between the input stage transistor and the output stage transistor. Regardless of the presence or absence of an impedance matching circuit between the stages of the multi-stage connection unit 130, the present embodiment defines the relationship between the film thickness and the gate length of the gate dielectric of the input stage transistor and the output stage transistor.

The example in which the semiconductor integrated circuit 100 is applied to the buffer amplification unit 35 has been described, but the present disclosure is not limited to this example. The semiconductor integrated circuit 100 can also be applied to other amplifiers. The semiconductor integrated circuit 100 can be applied to the power amplifier 373 and the LNA 381 in the millimeter wave radar system 10 described above. Further, in the present embodiment, the 40 nm generation bulk CMOS has been described as an example, but the present embodiment is not limited to this, and can be applied to semiconductor processes of various generations of gate length. The device structure is not limited to bulk CMOS, and can be applied to silicon on insulator (SOI) MOSFET and FinFET device structures.

Second Embodiment

The second embodiment is a modification of the preceding embodiment as a basic configuration and may incorporate description of the preceding embodiment. In the preceding embodiment, the standard power supply voltage is applied to operate the semiconductor integrated circuit 100 normally. Instead of this, the semiconductor integrated circuit 100 may be overdriven.

The circuit configurations of the semiconductor integrated circuit 100 and the multi-stage connection unit 130 are the same as those described in the preceding embodiment. In the present embodiment, a voltage exceeding the standard power supply voltage of 1.1 V is applied as the power supply voltage Vdd. That is, a voltage exceeding the standard power supply voltage is applied to the drains of the output stage transistors 1312a and 1312b. As a result, the semiconductor integrated circuit 100 is overdriven, and the power added efficiency is further improved.

Similar to FIG. 5A to FIG. 5F, FIG. 9A to FIG. 9F show the voltage amplitude at respective nodes and between nodes when the input voltage is changed from −10 dBm to 0 dBm in 2 dB steps at 40 GHz and is input to the input terminal of the input matching circuit 140. Here, the applied power supply voltage Vdd is 1.3 V, which is higher than the standard power supply voltage of 1.1 V.

Figure 9A:
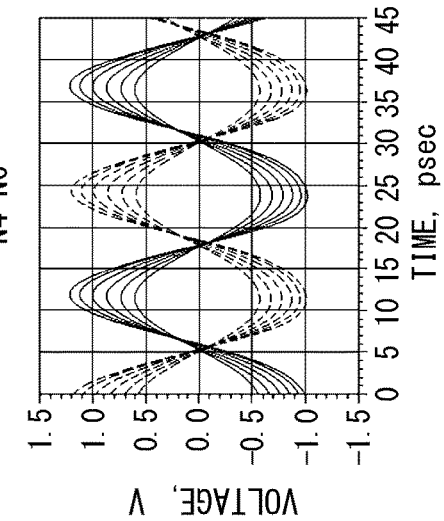
FIG. 9A to FIG. 9F are diagrams showing voltage amplitudes at respective nodes or between nodes in a semiconductor integrated circuit according to a second embodiment.
Figure 9D:
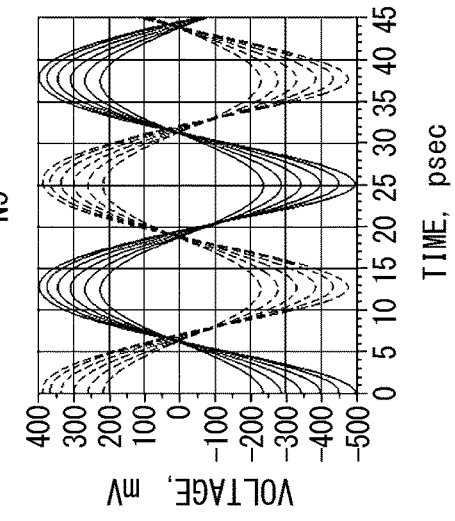
Figure 9C:
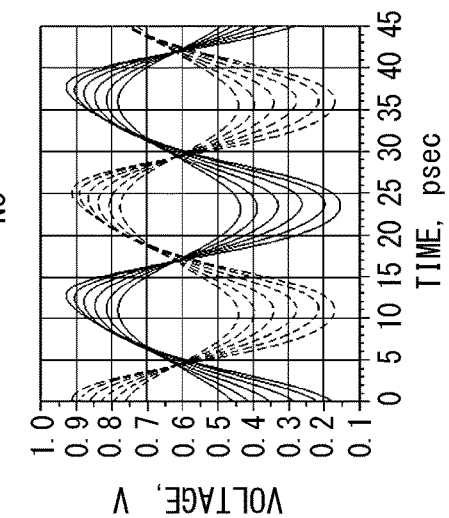
Figure 9E:
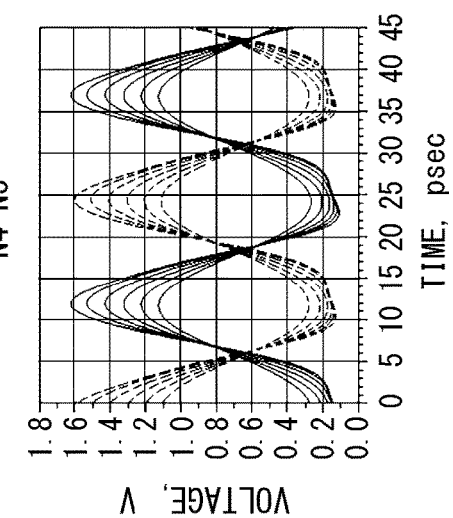
Figure 9B:
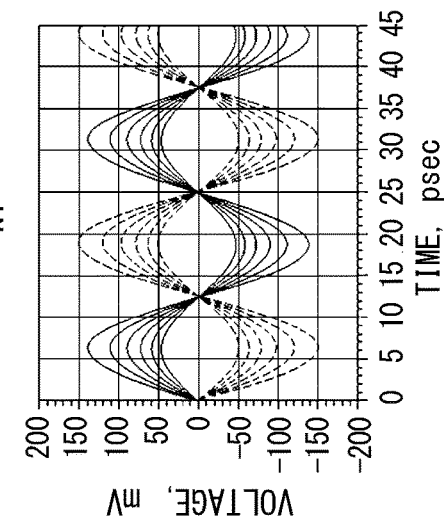
Figure 9F:
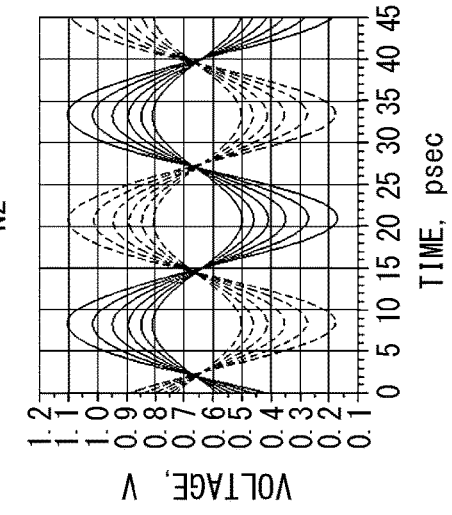

As shown in FIG. 9D, the maximum amplitude of the voltage Vds between the nodes N4-N3, that is, between the source and the drain of the output stage transistors is 1.62V. As in the preceding embodiment, the allowable voltage when the gate length is 40 nm exceeds 1.25 V, so that the reliability standard of the HCI is not satisfied. From the relationship between the gate length and the allowable voltage shown in FIG. 6, the gate length for ensuring reliability with respect to the voltage amplitude of 1.62 V is 160 nm. When the gate length is 160 nm, the allowable voltage increases to 1.63 V, which is 1.31 times when the gate length is 40 nm. Therefore, the issue of reliability with respect to the HCI can be solved. In the actual design, after setting the gate length of the output stage transistors to 160 nm, the simulation of FIG. 9A to FIG. 9F is performed, and it is confirmed whether the voltage amplitudes at respective nodes and between the nodes are within the allowable voltage. In the present embodiment, the gate length of the output stage transistors 1312a and 1312b is set to 160 nm. Other configurations are the same as those of the preceding embodiment.

Summary of Second Embodiment

In the present embodiment, as in the preceding embodiment, since the gate length is selected according to the voltage amplitude, the breakdown voltage with respect to the HCI can be improved without causing a significant decrease in the MAG/MSG. Since the breakdown voltage with respect to the HCI can be improved, the power supply voltage can be increased from the standard power supply voltage of 1.1 V, which is the power supply voltage during normal operation, and overdrive operation becomes possible. As a result, it is possible to improve the power added efficiency and the output power of the amplifier while ensuring the reliability.

The power supply voltage applied to the drain of the output stage transistor during the overdrive operation is not limited to the above example (1.3 V). Any voltage exceeding the standard power supply voltage of 1.1 V may be used. For example, the power supply voltage applied to the drain of the output stage transistor may be 1.2 V or 1.5 V.

The overdrive operation is applied in addition to the improvement of the power added efficiency at room temperature. For example, the overdrive operation is used to correct manufacturing variations such as device temperature characteristics and threshold voltage Vth. As an example, the performance of the MOS transistor 131 is lower than normal temperature at high temperature and higher than normal temperature at low temperature. Therefore, the power supply voltage Vdd is set to 1.1 V, which is the standard power supply voltage at room temperature, 0.9 V at low temperature, and 1.3 V at high temperature. In this way, when the device temperature is high, the overdrive operation may be performed.

Third Embodiment

The third embodiment is a modification of the preceding embodiments as a basic configuration and may incorporate description of the preceding embodiments. In the preceding embodiments, the semiconductor integrated circuit 100 is applied to the amplifier. Alternatively, the semiconductor integrated circuit 100 may be applied to a frequency multiplier.

Figure 10:
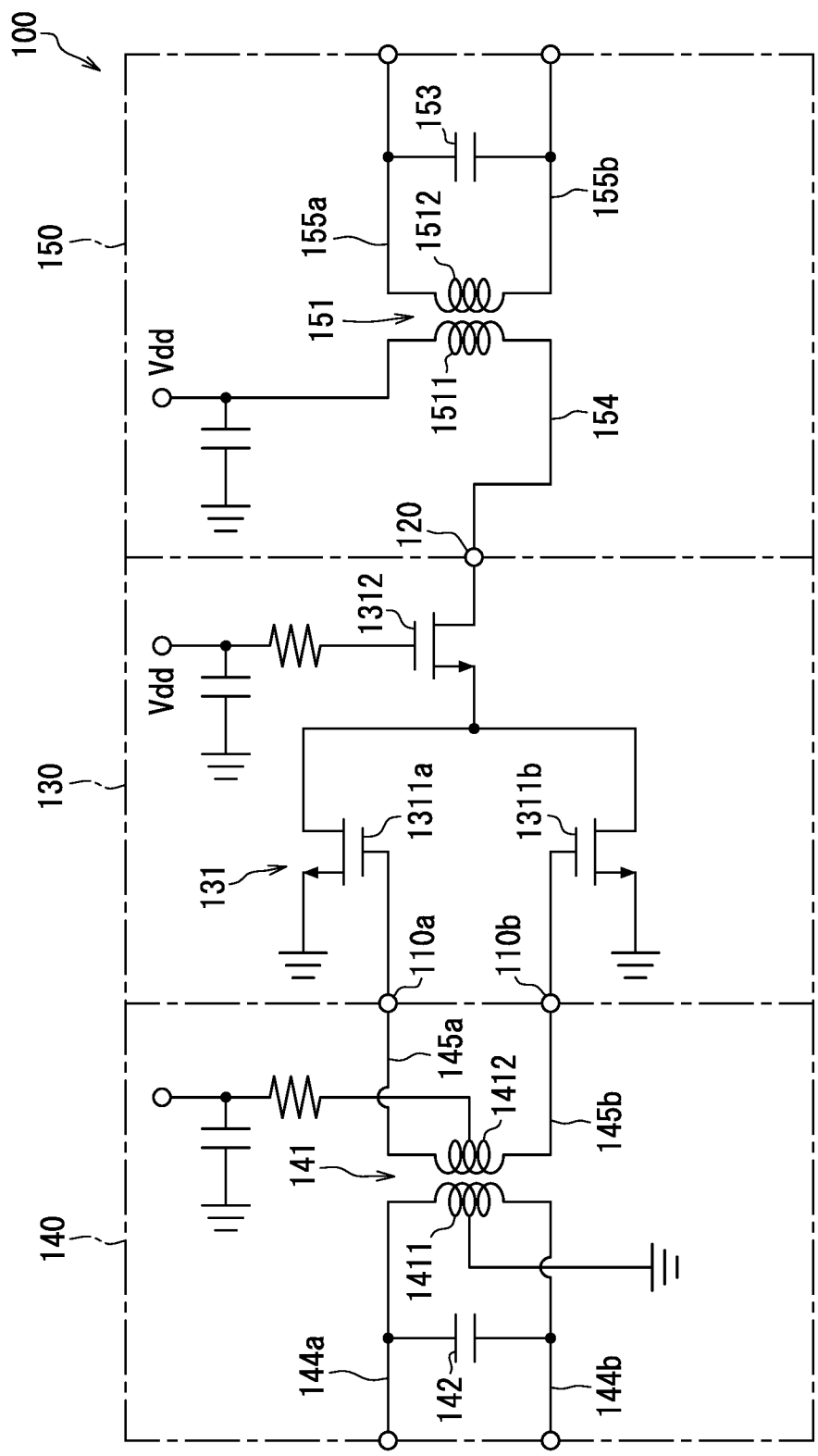
FIG. 10 is a circuit diagram showing a semiconductor integrated circuit according to a third embodiment.

As shown in FIG. 10, the semiconductor integrated circuit 100 of the present embodiment constitutes a frequency multiplier, specifically, a frequency doubler. The semiconductor integrated circuit 100 can be applied to the frequency doublers 36 and 372 in the millimeter wave radar system 10 described above. The semiconductor integrated circuit 100 constituting the frequency doubler includes a pair of input terminals 110a and 110b, one output terminal 120, a multi-stage connection unit 130, an input matching circuit 140, and an output matching circuit 150.

The multi-stage connection unit 130 is formed by connecting multiple MOS transistors 131 in multiple stages between the input terminals 110a and 110b and the output terminal 120. The MOS transistor 131 has a pair of input stage transistors 1311a and 1311b and one output stage transistor 1312. The input stage transistors 1311a and 1311b are both common-source. The output stage transistor 1312 is common-gate. The gates of the input stage transistors 1311a and 1311b are connected to the corresponding input terminals 110a and 110b. The drains of the input stage transistors 1311a and 1311b are connected to the source of the output stage transistor 1312. That is, the input stage transistors 1311a and 1311b and the output stage transistor 1312 are connected in multiple stages. The drain of the output stage transistor 1312 is connected to the output terminal 120. The multi-stage connection unit 130 is a frequency conversion unit that doubles the frequency of the input signal.

Each of the input matching circuit 140 and the output matching circuit 150 has a transformer and a capacitance as in the preceding embodiments. The input matching circuit 140 has a first transformer 141 and a fixed capacitance 142. The output matching circuit 150 has a second transformer 151 and a fixed capacitance 153.

In the second transformer 151, one end of the primary winding 1511 is connected to the output terminal 120 via the signal line 154. The power supply voltage Vdd is applied to the other end of the primary winding 1511. The configuration on the secondary winding 1512 side is the same as that of the preceding embodiments. The configurations of the input matching circuit 140 and the output matching circuit 150 can be selected from various types as described in the preceding embodiments. The winding number ratio of the first transformer 141 and the second transformer 151 is also not particularly limited.

The semiconductor integrated circuit 100 described above also has the same issue as those in the preceding embodiments. That is, when the output stage transistor has the same breakdown voltage and the same gate length as those of the input stage transistor, the amplitude of the voltage Vds of the output stage transistor exceeds the allowable voltage with respect to the HCI. Therefore, also in the present embodiment, the gate length is determined based on the relationship between the gate length and the allowable voltage shown in FIG. 6.

Specifically, normal breakdown voltage (1.1 V) transistors are usually used as all the MOS transistors 131. Further, the gate lengths of the input stage transistors 1311a and 1311b are set to 40 nm which is the minimum for the normal breakdown voltage transistors. The gate length of the output stage transistor 1312 is a value corresponding to the amplitude of the voltage Vds of the output stage transistor 1312, and is set to a value longer than the gate lengths of the input stage transistors 1311*a* and 1311*b*.

Summary of Third Embodiment

In the present embodiment, in the semiconductor integrated circuit 100 constituting the frequency multiplier, the thicknesses of the gate dielectrics of the input stage transistors and the output stage transistor are made equal, and the gate length of the output stage transistor is set to be longer than the gate lengths of the input stage transistor. Accordingly, the output power can be improved while ensuring the breakdown voltage with respect to the HCI, as in the case of the amplifier described in the preceding embodiments. By using the relationship shown in FIG. 6, any gate length can be selected according to the voltage amplitude.

In the semiconductor integrated circuit 100 constituting the frequency doubler, the input stage transistors of the multi-stage connection unit 130 is not limited to the common-source transistors. Further, the output stage transistor is not limited to the common-gate transistor. The semiconductor integrated circuit 100 can also be applied to a frequency multiplier other than the frequency doubler, for example, a frequency tripler that converts a frequency by a factor of three.

Fourth Embodiment

The fourth embodiment is a modification of the preceding embodiments as a basic configuration and may incorporate description of the preceding embodiments. In the preceding embodiments, the total gate width of the input stage transistor and the total gate width of the output stage transistor are made equal. However, the total gate width of the output stage transistor may be longer than the total gate width of the input stage transistor.

Figure 11:
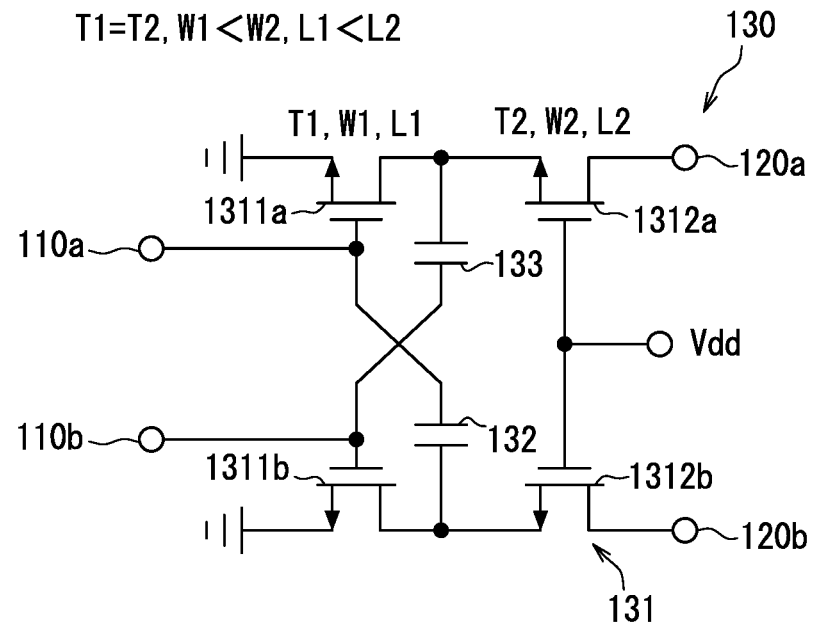
FIG. 11 is a circuit diagram showing a multi-stage connection unit of a semiconductor integrated circuit according to a fourth embodiment.

FIG. 11 shows a multi-stage connection unit 130 in the semiconductor integrated circuit 100 of the present embodiment. The circuit configuration is the same as that of the preceding embodiment (see FIG. 4). In the present embodiment, the input stage transistors 1311*a* and 1311*b* of the multi-stage connection unit 130 and the output stage transistors 1312*a* and 1312*b* satisfy the relationship of T1=T2, W1<W2, and L1<L2. In this way, the total gate width is also different between the input stage and the output stage. Other configurations are the same as those described in the first embodiment.

Summary of Fourth Embodiment

As described in the preceding embodiment (see FIG. 8), the series resistance component of the impedance of the output stage transistors 1312*a* and 1312*b* increases by the amount of increasing the gate length L2 of the output stage transistors 1312*a* and 1312*b*. In the present embodiment, the influence of the series resistance component can be relatively reduced by increasing the total gate width W2 of the output stage transistors 1312*a* and 1312*b*.

Impedance matching can also be achieved by adding elements such as parallel capacitance and series inductance between the stages of the multi-stage connection unit 130. However, in general, in a high frequency circuit in the millimeter wave band, the matching circuit itself has a loss, so that it may not be desirable to add an element. According to the present embodiment, it is possible to adjust the influence of increasing the gate length L2 without adding an impedance matching element between stages.

Fifth Embodiment

The fifth embodiment is a modification of the preceding embodiments as a basic configuration and may incorporate description of the preceding embodiments. In the preceding embodiments, for example, the total gate width of the input stage transistor and the total gate width of the output stage transistor are made equal. In another preceding embodiment, the total gate width of the output stage transistor is longer than the total gate width of the input stage transistor. Alternatively, the total gate width of the output stage transistor may be shorter than the total gate width of the input stage transistor.

Figure 12:
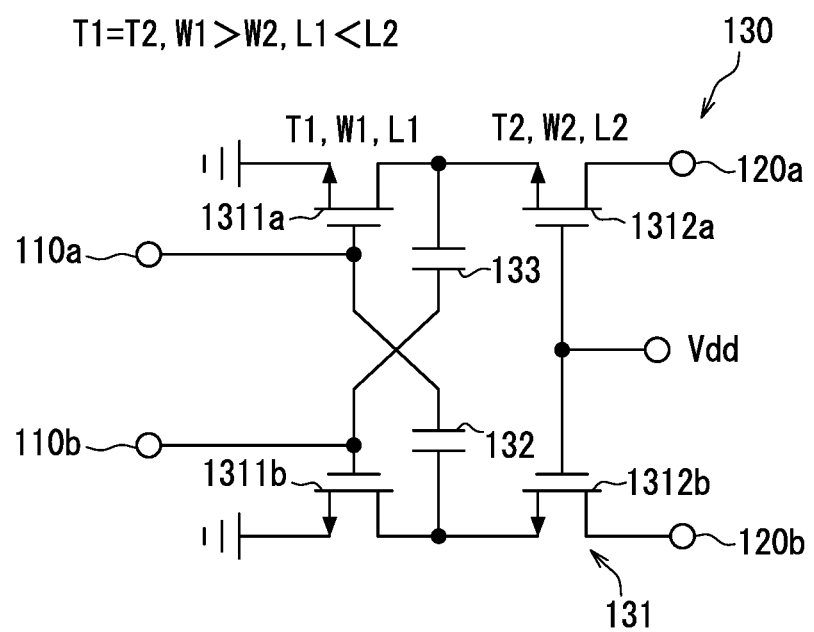
FIG. 12 is a circuit diagram showing a multi-stage connection unit of a semiconductor integrated circuit according to a fifth embodiment.

FIG. 12 shows a multi-stage connection unit 130 in the semiconductor integrated circuit 100 of the present embodiment. The circuit configuration is the same as that of the preceding embodiment (see FIG. 4). In the multi-stage connection unit 130 according to the present embodiment, the input stage transistors 1311*a* and 1311*b* and the output stage transistors 1312*a* and 1312*b* satisfy the relationship of T1=T2, W1>W2, and L1<L2. In this way, the total gate width is also different between the input stage and the output stage. Other configurations are the same as those described in the first embodiment.

Summary of Fifth Embodiment

As described in the preceding embodiment (see FIG. 8), the parallel capacitance component of the impedance of the output stage transistors 1312*a* and 1312*b* increases by the amount of increasing the gate length L2 of the output stage transistors 1312*a* and 1312*b*. In the present embodiment, the influence of the parallel capacitance component can be relatively reduced by shortening the total gate width W2 of the output stage transistors 1312*a* and 1312*b*. Accordingly, the effect of increasing the gate length L2 can be adjusted without adding an impedance matching element between stages.

Other Embodiments

The disclosure in this specification, the drawings, and the like is not limited to the exemplified embodiments. The disclosure encompasses the illustrated embodiments and modifications by those skilled in the art based thereon. For example, the disclosure is not limited to the combinations of components and/or elements shown in the embodiments. The disclosure may be implemented in various combinations. The disclosure may have additional portions that may be added to the embodiments. The disclosure encompasses omission of components and/or elements of the embodiments. The disclosure encompasses the replacement or combination of components and/or elements between one embodiment and another. The disclosed technical scope is not limited to the description of the embodiments. It should be understood that some disclosed technical ranges are indicated by description of claims, and includes every modification within the equivalent meaning and the scope of description of claims.

The disclosure in the specification, drawings and the like is not limited by the description of the claims. The disclosures in the specification, the drawings, and the like encompass the technical ideas described in the claims, and further extend to a wider variety of technical ideas than those in the claims. Therefore, various technical ideas can be extracted from the disclosure of the specification, the drawings and the like without being limited to the description of the claims.

The example in which the semiconductor integrated circuit 100 constitutes the differential signal amplifier has been described, but the present disclosure is not limited thereto. The semiconductor integrated circuit 100 can also be applied to a single-ended signal amplifier as long as it has a configuration including the multi-stage connection unit 130. In this case, the same effect as that of the preceding embodiments premised on the differential signal can be obtained.

What is claimed is:

1. A semiconductor integrated circuit comprising:
an input terminal;
an output terminal; and
a multi-stage connection unit configured to receive a high-frequency signal and including a plurality of metal oxide semiconductor transistors connected in a plurality of stages between the input terminal and the output terminal, wherein
the plurality of MOS transistors includes an input stage transistor connected to the input terminal and an output stage transistor connected to the output terminal,
each of the input stage transistor and the output stage transistor has a gate dielectric, and a thickness of the gate dielectric of the output stage transistor is equal to a thickness of the gate dielectric of the input stage transistor,
the output stage transistor has a gate length longer than a gate length of the input stage transistor,
the multi-stage connection unit forms a differential amplifier circuit, and
the multi-stage connection unit includes a pair of the input stage transistors and a pair of capacitances cross-coupled to the pair of the input stage transistors.

2. The semiconductor integrated circuit according to claim 1, wherein
the multi-stage connection unit is a cascode connection unit in which the input stage transistor is a common-source transistor, and the output stage transistor is a common-gate transistor.

3. The semiconductor integrated circuit according to claim 1, wherein
the plurality of MOS transistors only includes the input stage transistor and the output stage transistor.

4. The semiconductor integrated circuit according to claim 1, wherein
a gate length of the MOS transistor in each of the plurality of stages is set based on a relationship with an allowable voltage between a source and a drain.

5. The semiconductor integrated circuit according to claim 4, wherein
the drain of the output stage transistor is configured to be applied with a voltage exceeding a standard power supply voltage.

6. The semiconductor integrated circuit according to claim 1, wherein
a total gate width of the output stage transistor is longer than a total gate width of the input stage transistor.

7. The semiconductor integrated circuit according to claim 1, wherein
a total gate width of the output stage transistor is shorter than a total gate width of the input stage transistor.

8. The semiconductor integrated circuit according to claim 1, wherein
the semiconductor integrated circuit restricts a breakdown or a deterioration due to a hot carrier injection.

* * * * *